(12) United States Patent
Pio

(10) Patent No.: US 6,437,393 B1
(45) Date of Patent: Aug. 20, 2002

(54) NON-VOLATILE MEMORY CELL WITH SILICIDED CONTACTS

(75) Inventor: Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 57 days.

(21) Appl. No.: 09/636,114

(22) Filed: Aug. 10, 2000

Related U.S. Application Data

(62) Division of application No. 09/222,024, filed on Dec. 29, 1998, now Pat. No. 6,127,224.

(30) Foreign Application Priority Data

Dec. 31, 1997 (EP) .............................................. 97830745
May 22, 1998 (EP) .............................................. 98201715

(51) Int. Cl.[7] ............................................. H01L 29/74
(52) U.S. Cl. ...................... 257/314; 257/295; 257/298; 257/314; 257/315; 257/320; 257/326; 438/256
(58) Field of Search ............................... 257/295, 298, 257/314, 315, 326, 316, 317, 318, 319, 320, 245, 248; 438/258

(56) References Cited

U.S. PATENT DOCUMENTS

| | | |
|---|---|---|
| 5,023,680 A | 6/1991 | Gill et al. ................... 357/23.5 |
| 5,120,571 A | 6/1992 | Gill et al. ..................... 437/51 |
| 5,282,160 A * | 1/1994 | Yamagata ................... 365/185 |
| 5,326,999 A | 7/1994 | Kim et al. ................... 275/315 |
| 5,338,956 A | 8/1994 | Nakamura ................... 257/316 |
| 5,570,314 A * | 10/1996 | Gill .......................... 365/185.1 |
| 5,652,447 A * | 7/1997 | Chen et al. ................. 257/315 |
| 5,677,556 A | 10/1997 | Endoh ........................ 257/316 |
| 5,698,879 A | 12/1997 | Aritome et al. ............. 257/315 |
| 5,751,631 A | 5/1998 | Liu et al. ............... 365/185.01 |
| 5,879,990 A | 3/1999 | Dormans et al. ........... 438/257 |
| 5,960,283 A * | 9/1999 | Sato ........................... 438/257 |
| 5,985,768 A | 11/1999 | Speranza et al. ........... 438/783 |
| 6,207,500 B1 * | 3/2001 | Hu et al. .................... 438/258 |

FOREIGN PATENT DOCUMENTS

| | | |
|---|---|---|
| EP | 0 612 108 A1 | 8/1994 |
| JP | 6-232407 A | 8/1994 |

* cited by examiner

*Primary Examiner*—Jerome Jackson, Jr.
*Assistant Examiner*—Edgardo Ortiz
(74) *Attorney, Agent, or Firm*—Lisa K. Jorgenson; Robert Iannucci; Seed IP Law Group PLLC

(57) ABSTRACT

A non-volatile memory cell and a manufacturing process therefor are discussed. The cell is integrated in a semiconductor substrate and includes a floating gate transistor having a first source region, first drain region, and gate region projecting over the substrate between the first source and drain regions. The cell also includes a selection transistor having a second source region, second drain region, and respective gate region, projecting over the substrate between the second source and drain regions. The first and second regions are lightly doped and the cell comprises mask elements.

22 Claims, 7 Drawing Sheets

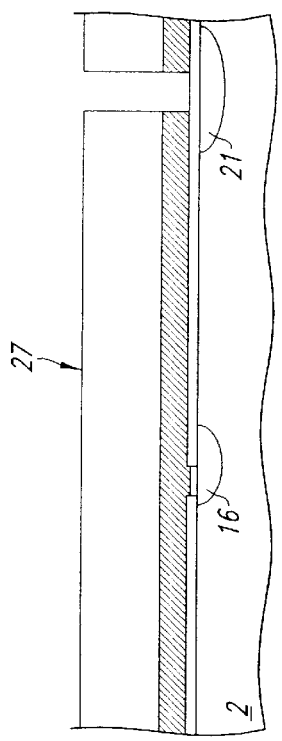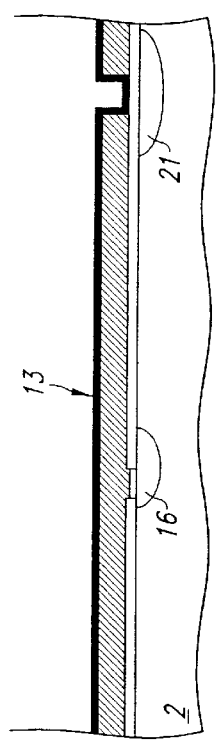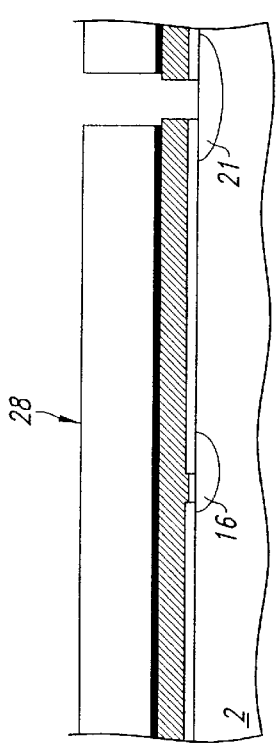

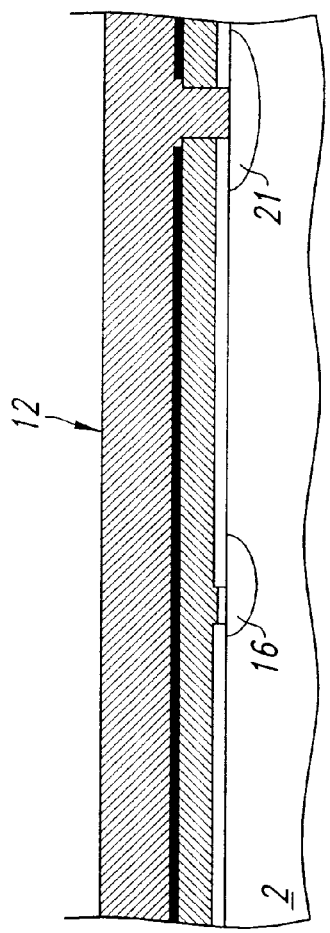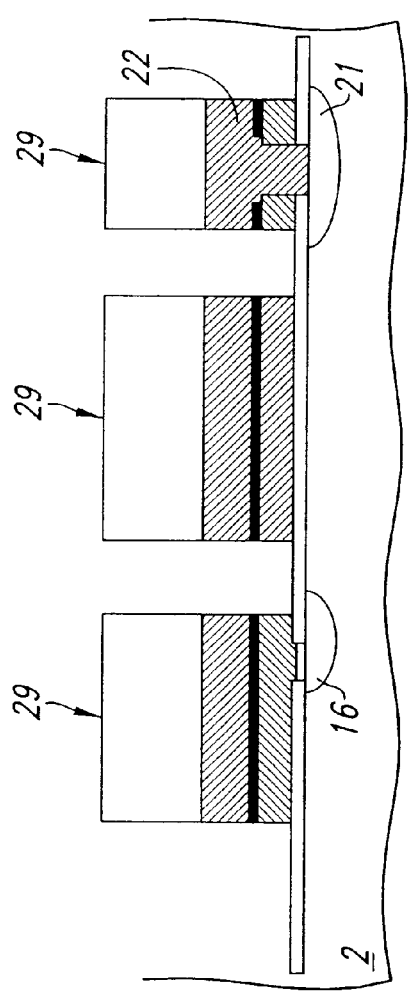

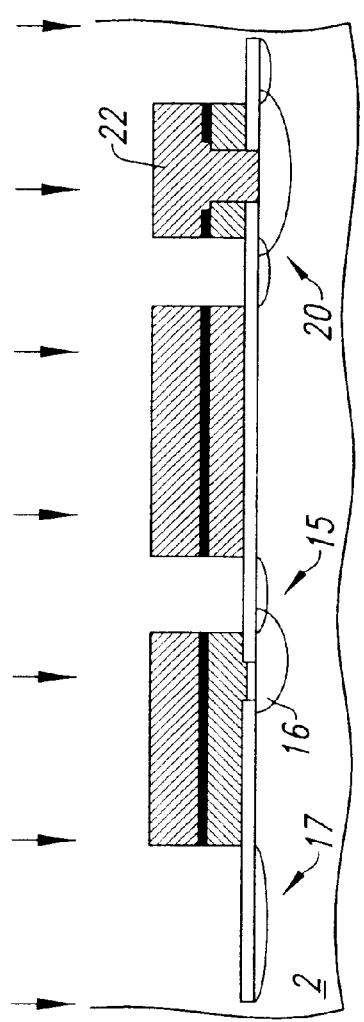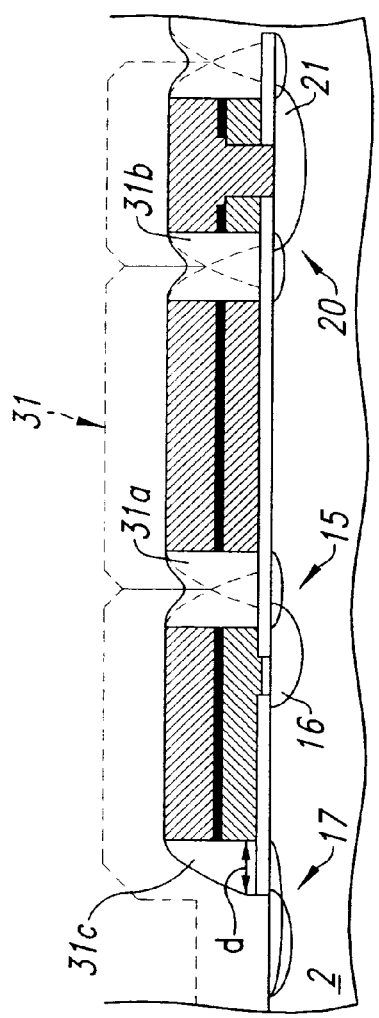

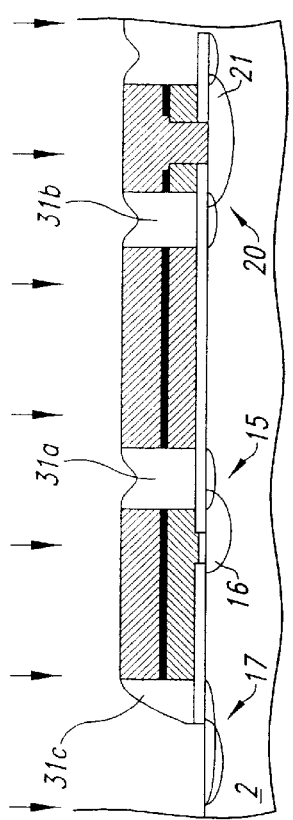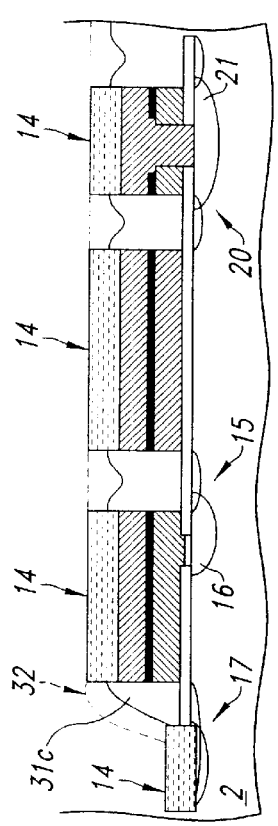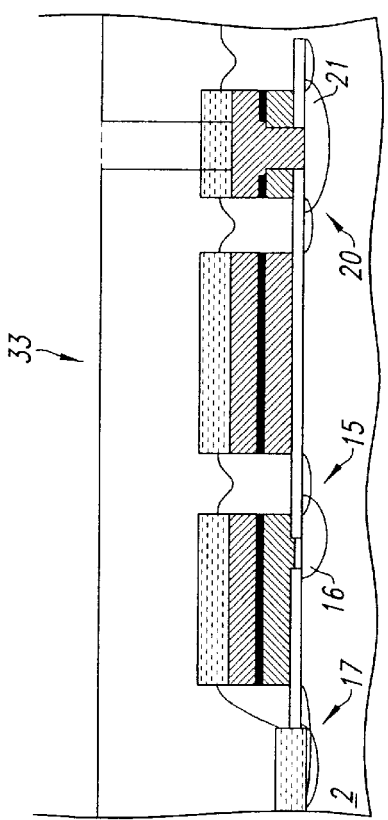

NON-VOLATILE MEMORY CELL WITH SILICIDED CONTACTS

CROSS-REFERENCE TO RELATED APPLICATION

This application is a divisional of pending U.S. patent application Ser. No. 09/222,024, filed Dec. 29, 1998. U.S. Pat. No. 6,127,224.

TECHNICAL FIELD

This invention relates to a non-volatile memory cell and a manufacturing process therefor, in particular a process employing suicides.

The invention relates to a non-volatile memory cell integrated in a semiconductor substrate and comprising:

- a floating gate transistor having a first source region, first drain region, and gate region projecting over the substrate and between said first source and drain regions; and
- a selection transistor having a second source region, second drain region, and respective gate region, projecting over the substrate, between said second source and drain regions.

Specifically, the invention relates to a process for manufacturing such a cell.

The invention relates in particular, but not exclusively, to the manufacturing process of a non-volatile memory cell, e.g. EEPROMs of the FLOTOX type, and the description that follows will cover this field of application for convenience of explanation.

BACKGROUND OF THE INVENTION

As is well known, the current technology for manufacturing semiconductor integrated circuits has succeeded in greatly reducing the resistance of interconnects and contact pads in the active areas of the individual devices, through the use of composite materials of silicon and a transition metal such as titanium or tungsten. These composite materials are known as silicides, and used for forming layers with relatively low resistivity.

These silicide layers cannot be used to fabricate devices having non-volatile memory cells, such as EEPROMs, Flash-EEPROMs or EPROMs, integrated therein, because relatively high voltages must be used for programming such memory cells, and the managing of these voltages is incompatible with silicidation processes.

In fact, these memory devices must be provided with lightly doped drain and source regions in order to stand such voltages.

The process employed to produce silicide layers may, however, cause problems in these relatively thin and lightly doped regions. During the thermal process for reacting the transition metal layer with the substrate surface and forming the silicide layer, a surface layer of the substrate is expended, and some dopant from the substrate is taken up by the silicide layer so that, during normal operation, the silicide layer becomes shorted to the substrate.

In addition, high strength electric fields develop between the active area and the isolation region, at the cell drain region contact.

Sometimes, the contact size is larger than that of the active area, and results in a short circuit forming between the silicized junction and the substrate of different concentration.

Even where the contact is fully contained within the active area, the voltage applied to it would be transferred into the silicized region up to the border region of the isolation region.

SUMMARY OF THE INVENTION

An embodiment of this invention provides a non-volatile memory cell with good performance in terms of access time, and overcomes the limitations of prior art structures.

An object of the inventive process is to arrange for the lightly doped regions of the memory cells to be screened without requiring additional process steps.

The embodiment provides a memory cell with silicide layers to improve the cell access time.

The features and advantages of the memory cell according to the invention will be apparent from the following description of an embodiment thereof, given by way of non-limitative example with reference to the accompanying drawings.

BRIEF DESCRIPTION OF THE DRAWINGS

FIGS. 3 to 15 illustrate process steps for manufacturing the structure of FIG. 2.

DETAILED DESCRIPTION

Figure 1:
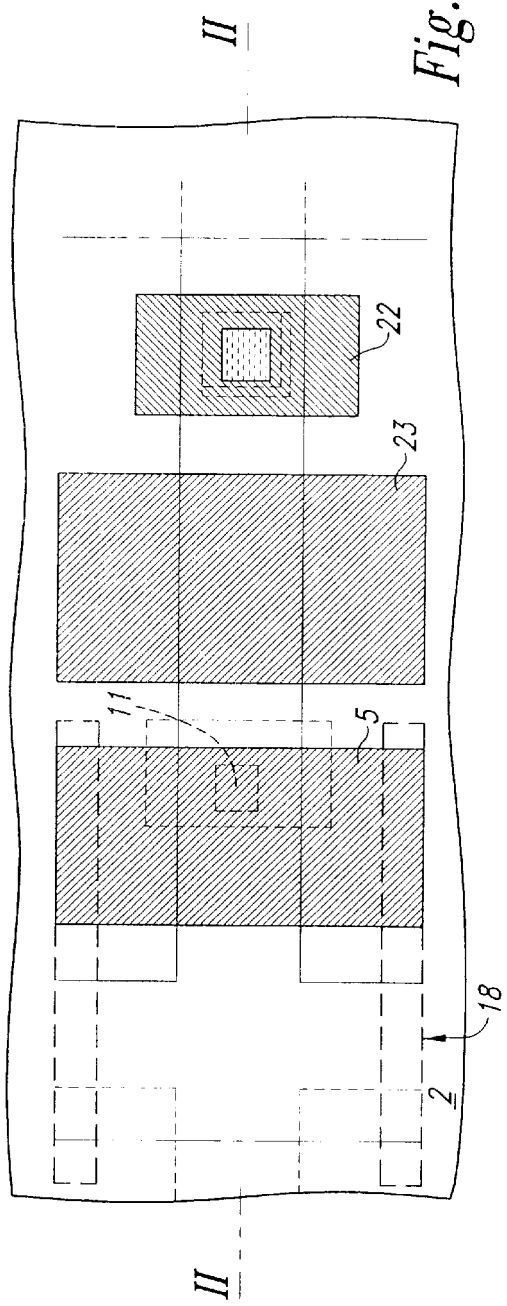
FIG. 1 is a top plan view of a T-shaped cell according to the invention.
Figure 2:
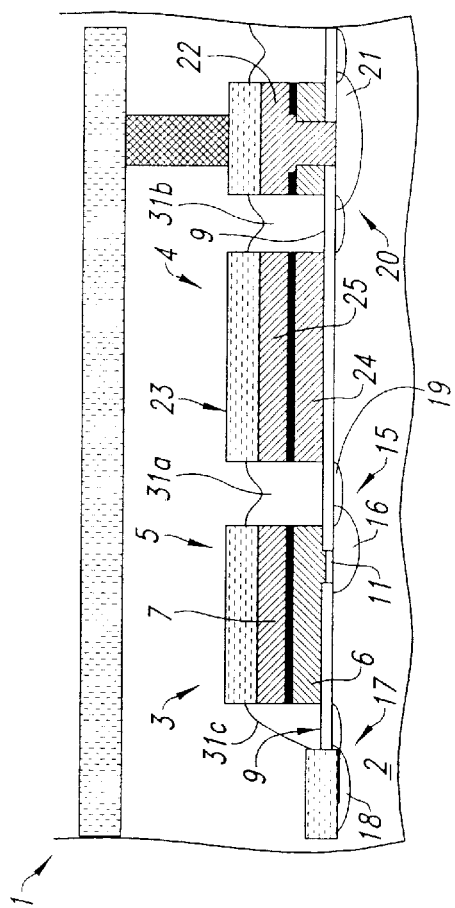
FIG. 2 is a sectional view of the cell shown in FIG. 1, taken along line II—II.

Referring to the drawing views, generally shown at 1 is an EEPROM memory cell of the FLOTOX type with two levels of polysilicon, having a T-shape and being integrated in a semiconductor substrate 2 of the P type.

Reference will be made in the ensuing description to a preferred embodiment employing devices of the N type. For devices of the P type, the types of conductivities mentioned hereinafter would have to be reversed.

The memory cell 1 comprises a floating gate transistor 3, and an associated selection transistor 4 for selecting a cell to be programmed from a group of cells in a memory matrix.

The floating gate transistor 3 comprises a drain region 15 and a source region 17.

The drain region 15 is formed by an N– type implant in the substrate 2.

Formed at this drain region 15 is a more heavily doped region 16 of the N+ type which extends to beneath the tunnel region 11.

The source region 17 of the cell 1 is formed by implanting the substrate 2 with a dopant of the N type.

Contacting this source region 17 is a contact region 18 which is formed by implantation with a dopant of the N+ type and has a silicide layer 14 formed thereon.

Specifically in this architecture, this region 18 is shared by groups of cells of one memory matrix.

The substrate region 2 included between the drain 15 and source 17 regions forms a channel region of the transistor 3, which is overlaid by the gate region 5 in an isolated manner from said channel region and with the interposition of an oxide layer 9. In known way, the gate region 5 conventionally comprises a floating gate 6 and control gate 7.

The floating gate 6, formed in a first polysilicon layer 8, is over an oxide layer 9 which has a thinner portion 11 of tunnel oxide through which the electrons will pass during the cell 1 write and erase operations. A control gate 7 is formed in a second polysilicon layer 12 and isolated over the floating gate 6 by an interposed intermediate oxide layer 13. This control gate 7 comprises a silicide layer 14.

The selection transistor 4 has a source region 19 of the N− type coinciding with the drain region 15 of the floating gate transistor 10, and a drain region formed in the substrate 2 of the P type.

This region 20 directly contacts a contact region 21, formed by implanting with a dopant of the N+ type. A contact head 22 is provided over this contact region.

This head 22 comprises a first portion formed of the polysilicon layer 8 and isolated from the region 21 by the oxide layer 9, and a second portion formed of the second polysilicon layer 12 and in direct contact with the region 21.

Said first portion surrounds said second portion.

Advantageously, said first portion may be overlaid by the oxide layer 13.

The second portion is overlaid by a silicide layer 14.

From the portion of the substrate 2, included between the source 19 and drain 20 regions, a gate region 23 is projecting, which region is isolated from the substrate 2 by the oxide layer 9.

Advantageously, the gate region 23 comprises two overlapping polysilicon regions 24, 25 formed in the first and second polysilicon layers 8 and 12, respectively, with the interposition of the intermediate oxide layer 13; both regions 24 and 25 are then shortcircuited electrically outside the cells (Short-Circuited Double Polysilicon SCDP). The gate region further comprises a silicide layer 14.

Advantageously, mask elements 31a, 31b of a dielectric material are provided between the gate regions 5 and 4, and optionally between the gate region 4 and the contact head 22.

Advantageously, a spacer 31c, also made of a dielectric material, is formed on the side of the gate region 3 next to the source region 17.

Referring to FIGS. 3 to 14, an embodiment of the inventive process for manufacturing the aforesaid cell 1 includes selectively forming, over the substrate 2 surface, a first layer of field oxide to define an active area of the cell 1.

A photoresist layer 26 is formed selectively to define the areas where the capacitor-containing regions 16, and the contact regions 21 of the drain region 20 of the selection transistor 4, are to be formed.

Figure 3:
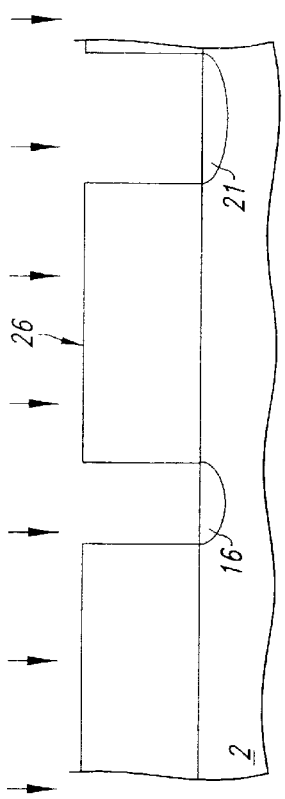

A first implantation of the N+ type is carried out to form these regions 16, 21 (FIG. 3).

Figure 4:
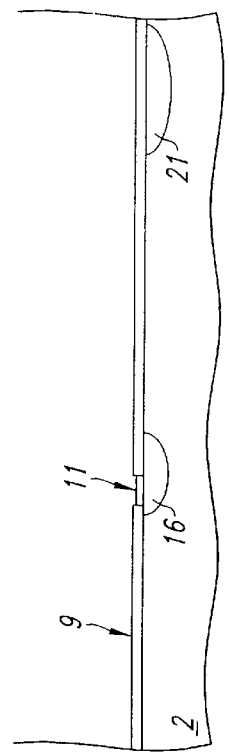

A second oxide layer 9 having a first thickness for forming the gate oxides of the cell 1, and a third oxide layer 11 having a second thickness smaller than the second layer 9, are then formed selectively to provide the tunnel oxide for the cell 1 (FIG. 4).

Figure 5:
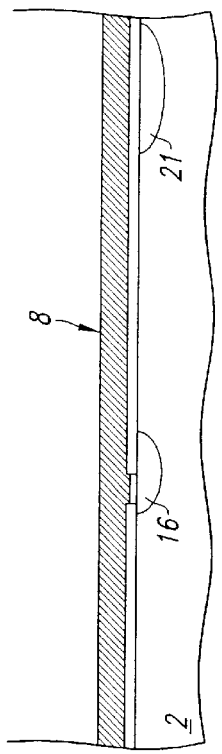
Figure 16:
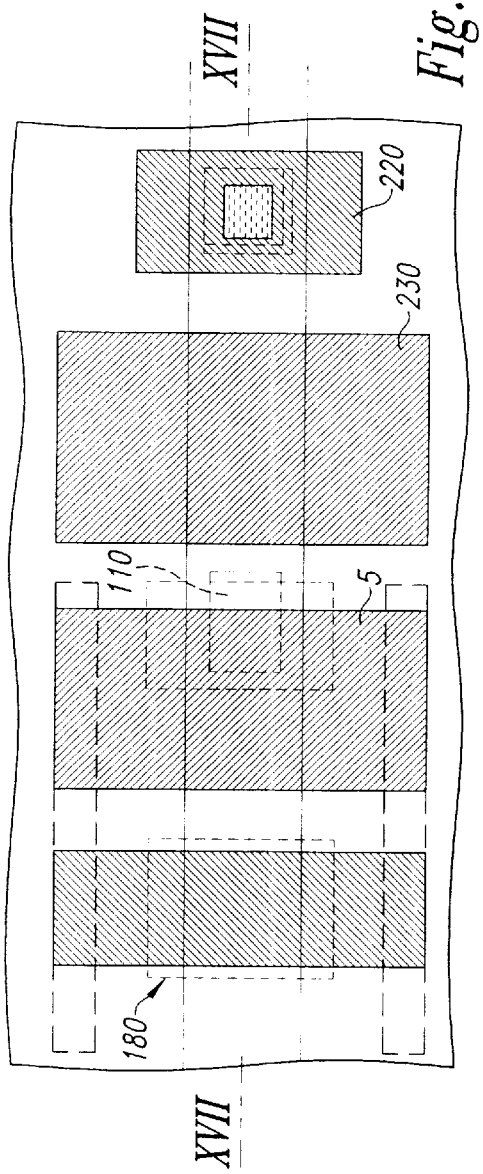
FIG. 16 is a top plan view of an I-shaped cell according to the invention.

Thereafter, a first polysilicon layer 8 is deposited, as shown in FIG. 5, and selectively removed from the area of the contact region 5 (FIG. 6) by means of a photolithographic process wherein a first mask 27 is used.

A fourth layer 13 of intermediate oxide is next formed all over the substrate 2 surface, as shown in FIG. 7, which layer is then removed selectively, using a photolithographic process wherein a second mask 28 is used, to clear the silicon surface 2 at the area of the contact region 21 (FIG. 8).

A second layer 12 of polysilicon is deposited to form the control gates 7 of the cell 1, and establish a direct contact with the contact region 21 where the first layer 8 of polysilicon has been removed (FIG. 9).

Both polysilicon layers are then removed selectively, by a photolithographic process wherein a third mask 29 is used, to define the gates 3 and 4, interconnects, and contact heads 22 of the drain region 20 of the selection transistor 4, by self-aligned etching (FIG. 10).

A second implantation, of the N− type, is carried out to provide the source 17 and drain 15 regions of the floating gate transistor 3, and the drain region 20 of the selection transistor 4 (FIG. 11).

A dielectric layer 31 is formed and immediately etched out to form spacers for the circuitry and a spacer 31c on the side of the gate region 3 next to the source region 17.

Advantageously in the matrix of memory cells, this dielectric material between the floating gate 3 and the selection transistor 4, and optionally between the selection transistor 3 and the contact head 22, is removed to a depth short of the substrate 2 surface.

Thus, respective mask and isolating elements 31a, 31b are formed between the gate regions 5, 4, and between the gate region 4 and the contact head 22.

Advantageously, the distances between the gate regions 5, 4, and between the gate region 4 and the contact head 22 are less than twice the width d of the spacer element 31c (FIG. 12).

In this way, over the drain region 15, and optionally the drain region 20 as well, the step of etching out the oxide layer 31 in order to form the spacer element 31c will be insufficient to remove the oxide layer 31 down to the substrate surface, and the mask elements 31a and 31b can be formed without any more process steps than those described.

The drain regions 15, 20 are then covered with a thick dielectric layer to provide a screen for a subsequent implantation with a dopant of the N+ type.

A third implantation with dopant of the N+ type is then carried out to provide the contact region 18 of the source region 17 (FIG. 13).

Subsequently, a metal layer 32 is formed over the entire surface of the substrate 2, and the polysilicon layers. A thermal treatment is applied, causing the metal layer 32 to react with the substrate 2 surface and produce a silicide layer 14 (FIG. 14).

During the thermal treatment, the transition metal 32 only reacts with those portions of the substrate 2 and the polysilicon layer 12 where no spacers are provided. The gate regions 5 and 23, contact head 22, and contact region 18 are then covered with a silicide layer having relatively low resistance.

A sixth layer 33 of intermediate oxide is deposited and then removed selectively to define the contact areas of the contact head 22.

The memory cell 1 is then completed conventionally.

Figure 17:
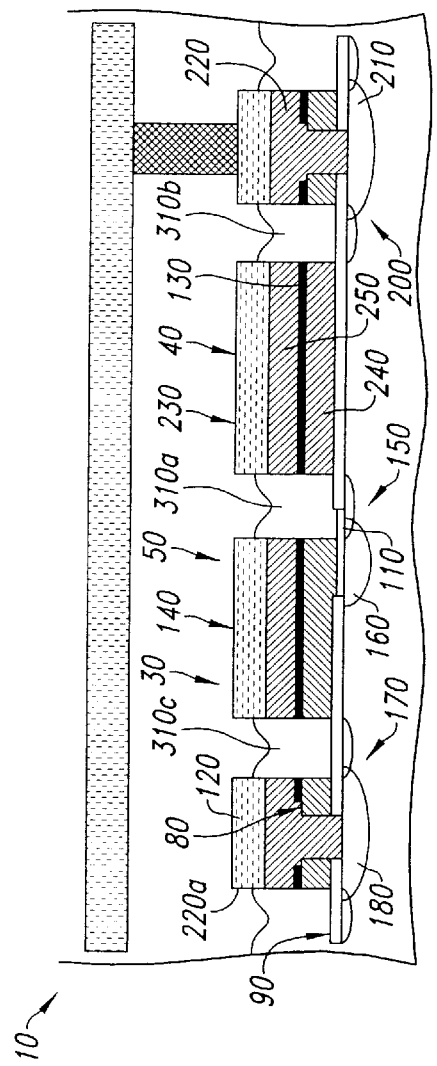
FIG. 17 is a sectional view of the cell shown in FIG. 16, taken along line XVII—XVII.

The process described above may also be applied to the manufacturing process of an I-shaped EEPROM cell 10 as shown in FIG. 17.

Specifically in this I-shaped memory cell structure, the source region 170 of the cell 10 is not shared by the memory cells of at least one byte, and the voltage must be applied from a common polysilicon line, for all the cells of one byte, which line is to be in direct contact with the source diffusions of each cell.

Advantageously, the process for manufacturing an I-shaped memory cell comprises forming a contact head 220a by the same process steps as for the head 220.

The memory cell 10 comprises a floating gate transistor 30, and a selection transistor 40 for selecting a cell to be programmed from a group of cells in a memory matrix.

A drain region 150 is formed by an implant of the N type in the substrate 2. At this drain region 150, a more heavily doped region 160 of the N+ type is provided which extends to beneath the tunnel region 110.

A source region 170 of the cell 10 is formed by implantation with a dopant of the N− type in the substrate 2.

This region 170 also directly contacts a contact region 180, formed by implanting with a dopant of the N+ type. A contact head 220a is provided over this contact region.

This head 220a comprises a first portion formed of the first polysilicon layer 80 and isolated from the region 180 by the oxide layer 90, and a second portion formed of the second polysilicon layer 120 and in direct contact with the region 180.

Said first portion surrounds said second portion.

Advantageously, said first portion may be overlaid by the oxide layer 130.

The second portion is overlaid by a silicide layer 140.

That portion of the substrate 2 which intervenes between the drain 150 and source 170 regions forms a channel region of the transistor 30, whereon the gate region 50 is provided, isolated from the channel region, with the interposition of an oxide layer 90. In known way, the gate region 50 comprises conventionally a floating gate 60 and control gate 70.

The floating gate 60 is formed in a first polysilicon layer 80 over an oxide layer 90 which has a thinner portion 110 of tunnel oxide. A control gate 70 is formed in a second polysilicon layer 120 and is isolated over the floating gate 60 by an interposed intermediate oxide layer 130. This control gate 70 comprises a silicide layer 140.

The selection transistor 40 has a source region 190 of the N− type coinciding with the drain region 150 of the floating gate transistor 30, and a drain region 200 formed in the substrate 2 of the P type.

This region 200 also directly contacts a contact region 210, to be formed by implanting with a dopant of the N+ type. A contact head 220 is provided over this contact region.

This head 220 comprises a first portion formed of the polysilicon layer 80 and isolated from the region 210 by the oxide layer 90, and a second portion formed of the second polysilicon layer 120 and in direct contact with the region 210.

Said first portion surrounds said second portion.

Advantageously, said first portion may comprise the oxide layer 130.

The second portion is overlaid by a silicide layer 140.

That portion of the substrate 2 which intervenes between the source 190 and drain 200 regions comprises a gate region 230 which is isolated from the substrate 2 by the oxide layer 90.

The gate region 230 comprises two overlapping polysilicon regions 240, 250 formed in the first and second polysilicon layers 80 and 120, respectively, with the interposition of the intermediate oxide layer 130; both regions 240 and 250 are then shortcircuited electrically outside the cells (double shortcircuited polysilicon). The gate region further comprises a silicide layer 140.

Advantageously, mask elements 310a, 310b, 310c of a dielectric material are provided between the gate regions 50 and 40, optionally between the gate region 40 and the contact head 220, as well as between the gate region 50 and the contact head 220a.

From the foregoing it will be appreciated that, although specific embodiments of the invention have been described herein for purposes of illustration, various modifications may be made without deviating from the spirit and scope of the invention. Accordingly, the invention Is not limited except as by the appended claims.

What is claimed is:

1. A non-volatile memory cell integrated in a semiconductor substrate, comprising:
   a floating gate transistor having a first source region, a first drain region, and a first gate region projecting over the substrate between said first source and drain regions; and
   a selection transistor having a second source region, second drain region, and second gate region, projecting over the substrate between said second source and drain regions; and
   wherein said first drain and second source regions are lightly doped and are covered by a mask element that extends completely between the first and second gate regions, wherein the first drain region and the second source region coextensively underlie the mask element between the first and second gate regions.

2. A memory cell according to claim 1, wherein the gate region of the selection transistor comprises a silicide layer.

3. A memory cell according to claim 1, wherein the gate region of the floating gate transistor comprises a silicide layer.

4. A memory cell according to claim 1, wherein said second drain region of the selection transistor directly contacts a contact region which is more heavily doped than said second drain region.

5. A memory cell according to claim 4, wherein a contact head projects over said contact region.

6. A memory cell according to claim 5, wherein said contact head is formed by polysilicon.

7. A memory cell according to claim 6, wherein said contact head comprises a first portion formed in a first polysilicon layer around a second portion formed in a second polysilicon layer.

8. A memory cell according to claim 1, wherein said memory cell is a T-shaped EEPROM memory cell.

9. A memory cell according to claim 1, wherein said memory cell is an I-shaped EEPROM memory cell.

10. The non-volatile memory cell according to claim 1, further comprising a dielectric layer positioned on the transistor and the mask element, and being completely isolated by the mask element from the substrate between the gate regions.

11. An integrated non-volatile memory cell, comprising:
    a semiconductor substrate that includes doped source and drain regions for a floating gate transistor and a first contact region that contacts the source region, the first contact region being more heavily doped than the source region;
    a gate region projecting from the substrate between the source and drain regions, the gate region including a floating gate and a control gate;
    a semiconductor contact head projecting from the first contact region;
    a mask layer on the source and drain regions and a region between the gate region of the floating gate transistor and the contact head; and a low resistance layer formed on the gate region and the contact head.

12. The memory cell of claim 11 wherein the low resistance layer is a silicide layer.

13. The memory cell of claim 11, further comprising:
a selection transistor adjacent to the floating gate transistor, the selection transistor including source, drain, and gate regions, wherein the mask layer extends over the source and drain regions of the selection transistor and the low resistance layer extends over the gate region of the selection transistor.

14. The memory cell of claim 13, further comprising a second contact region that contacts the drain region of the selection transistor, the second contact region being more heavily doped than the drain region of the selection transistor.

15. The memory cell of claim 14, further comprising:
a semiconductor second contact head projecting from the second contact region, wherein the mask layer extends over a region between the gate region of the selection transistor and the second contact head and the low resistance layer extends over the second contact head.

16. The memory cell of claim 13 wherein the drain region of the floating gate transistor and the source region of the selection transistor coextensively underlie the mask element between the gate regions.

17. A non-volatile memory cell integrated in a semiconductor substrate, the memory cell comprising:
a floating gate transistor having a first source region, first drain region, and first gate region, said first gate region being raised above the substrate between said first source and drain regions;

a selection transistor having a second source region, second drain region, and second gate region, said second gate region being raised above the substrate between said second source and drain regions; and a mask element over at least some of the source and drain regions, the mask element extending completely between the first and second gate regions, the mask element including a dielectric spacer immediately adjacent one of the gate regions, the dielectric spacer having a width that is more than half of a distance between the gate regions.

18. The memory cell of claim 17 wherein the gate regions each comprise a silicide layer.

19. The memory cell of claim 17 wherein the second drain region of the selection transistor directly contacts a contact region which is more heavily doped than the second drain region.

20. The memory cell of claim 19 wherein a contact head projects over said contact region, wherein said contact head comprises a first portion formed in a first polysilicon layer around a second portion formed in a second polysilicon layer.

21. The memory cell of claim 17 wherein the first drain region and the second source region coextensively underlie the mask element between the first and second gate regions.

22. A non-volatile memory cell according to claim 17, further comprising a dielectric layer positioned on the transistor and the mask element, and being completely isolated by the mask element from the substrate between the gate regions.

* * * * *

UNITED STATES PATENT AND TRADEMARK OFFICE
CERTIFICATE OF CORRECTION

PATENT NO. : 6,437,393 B1  Page 1 of 1
DATED : August 20, 2002
INVENTOR(S) : Federico Pio It is certified that error appears in the above-identified patent and that said Letters Patent is hereby corrected as shown below:

Column 1,
Line 14, "employing suicides" should read as -- employing silicides --.

Signed and Sealed this

Twenty-seventh Day of January, 2004

JON W. DUDAS
*Acting Director of the United States Patent and Trademark Office*